United States Patent

[11] 3,596,136

[72] Inventor Albert George Fischer
Trenton, N.J.
[21] Appl. No. 824,146
[22] Filed May 13, 1969
[45] Patented July 27, 1971
[73] Assignee RCA Corporation

[54] OPTICAL SEMICONDUCTOR DEVICE WITH GLASS DOME
6 Claims, 9 Drawing Figs.

[52] U.S. Cl. ........ 317/234 R, 317/235 N, 317/234 F, 313/108 D, 161/192, 250/217, 106/47

[51] Int. Cl. ........ H01l 3/00, H01l 5/00

[50] Field of Search ........ 317/234, 235; 313/108 D; 161/192, 193; 250/217; 106/47, 46, 48

[56] References Cited

UNITED STATES PATENTS

| | | | |
|---|---|---|---|
| 3,354,316 | 11/1967 | Deverall | 317/234 X |
| 3,413,187 | 11/1968 | Krause et al. | 317/234 X |
| 3,440,068 | 4/1969 | Patterson et al. | 317/234 X |
| 3,486,082 | 12/1969 | Sakamoto | 317/235 X |
| 3,510,732 | 5/1970 | Amans | 317/235 X |

FOREIGN PATENTS

| | | | |
|---|---|---|---|
| 1,243,268 | 6/1967 | Germany | 313/108 |

OTHER REFERENCES

High-Efficiency Electroluminescent Diodes, by Shah IBM Technical Disclosure Bulletin Vol. 9 No. 7 Dec. 66 pp. 947 and 948. Copy in Group 250 313/108D.

Visible Light-Emitting Diode, by Stuby et al.; IBM Technical Disclosure Bulletin Vol. 10 No. 8 Jan. 68. page 1120, copy in Group 250 313/108 D.

*Primary Examiner*—John W. Huckert
*Assistant Examiner*—Andrew J. James
*Attorney*—Glenn H. Bruestle

ABSTRACT: An optical semiconductor device including an electroluminescent diode mounted on a support so that radiation from the diode is emitted away from the support. A glass dome is mounted on the support and covers the diode so as to be in intimate contact with the diode. The radiation emitted from the diode passes through the glass dome so as to improve the external emission efficiency of the device.

The optical semiconductor device is made by mounting the electroluminescent diode on a support and then forming a glass dome over the diode with the glass dome being in intimate contact with and fused to the diode. The glass dome may be formed by placing a preformed glass bead on a heated diode and support subassembly, or by melting a glass in a mold cavity and placing the diode and support subassembly onto the soft glass while in the mold.

BEST AVAILABLE COPY

INVENTOR
Albert George Fischer
BY
ATTORNEY

BEST AVAILABLE COPY

INVENTOR
*Albert George Fischer*
BY [signature]
ATTORNEY

BEST AVAILABLE COPY

LARGE MOLDED HEMISPHERE

SMALL FREELY-FORMED DOME

INVENTOR
Albert George Fischer
BY [signature]
ATTORNEY

OPTICAL SEMICONDUCTOR DEVICE WITH GLASS DOME

BACKGROUND OF THE INVENTION

The present invention relates to the field of optical semiconductor devices and more particularly to an electroluminescent diode of improved efficiency and methods for making the same.

It is well known that electroluminescence is exhibited in the vicinity of a PN junction which is biased so as to inject charge carriers of one type into a region where the predominant charge carriers are of opposite type. Light is emitted in conjunction with the recombination of pairs of oppositely charged carriers.

Electroluminescent diodes are generally formed of single crystal wafers of the group III-V materials, such as GaAs, $GaAs_{1-x}P_x$ and $AL_xGa_{1-x}As$, having a PN junction therein. The electroluminescent light that is generated by the recombination of pairs of oppositely charged carriers in the single crystal wafers has great difficulty escaping the crystal. Since the crystals have high indices of refraction, generally about 3.5, and are usually in the shape of rectangular parallelepipedons, internal total reflection permits only light of a narrow cone of about 16° opening angle to be transmitted through the surface. This is only a few percent of the emitted light. The rest is totally reflected from surface to surface until it is finally absorbed inside the crystal or by the dark electrodes, or until it finds an irregularity in the surface of the crystal so that it can finally escape.

Heretofore attempts have been made to overcome this loss mechanism. One method used has been to shape the crystal in the form of a hemisphere with the light-emitting junction located at the flat bottom surface of the hemisphere. Although this construction has achieved a substantial increase in the emitted light, it has a number of disadvantages. One disadvantage is that the wafer must be shaped by grinding and polishing. This is both a costly and time consuming operation and therefore not well suited for large scale production. Another disadvantage arises from the need to use excessively thick wafers as a starting material. A preferred method of making an electroluminescent diode is to epitaxially form a thin layer of the semiconductor material on a thick substrate. The epitaxial layer of such diodes is too thin for shaping, and the substrate strongly absorbs emission from the higher energy gap epitaxial layer. Another method which has been used to increase the light emission from electroluminescent diode is to form a hemispherial dome of a transparent organic material over the diode. However, this technique has the disadvantage that the low refractive index of the organic material, generally not greater than 1.8, limits the efficiency improvement achieved.

SUMMARY OF INVENTION

An optical semiconductor device including an electroluminescent semiconductor diode and a glass dome covering and in intimate contact with the diode so that any radiation emitted from the diode passes through the dome. The optical semiconductor device is made by forming a glass dome over and in intimate contact with the electroluminescent diode.

DETAILED DESCRIPTION

Figure 8A:
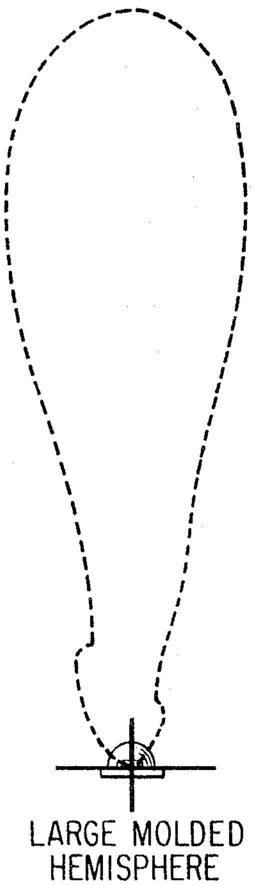
Figure 8B:
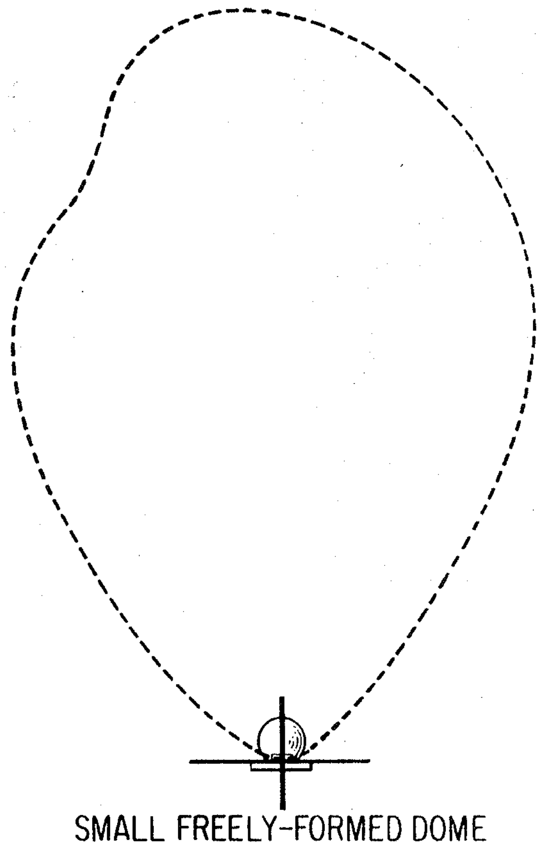

FIGS. 8*a* and 8*b* are schematic views showing different types of radiation emission patterns that can be obtained with the optical semiconductor device of the present invention.

Figure 1:
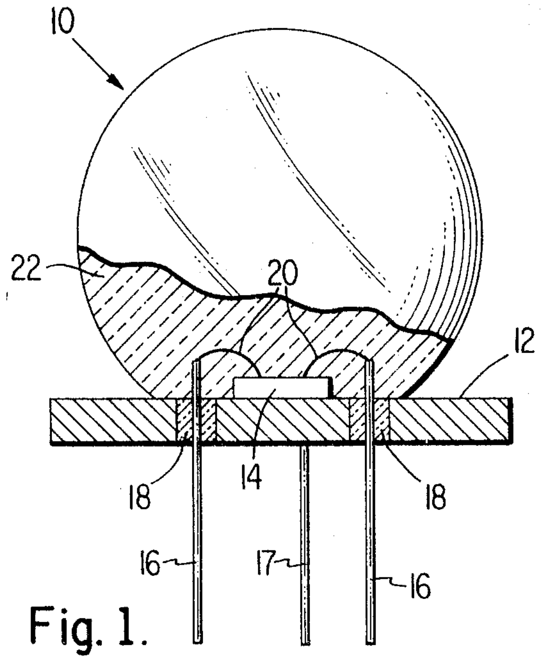
FIG. 1 is a sectional view of an embodiment of the optical semiconductor device of the present invention.

Referring initially to FIG. 1, an embodiment of the optical semiconductor device of the present invention is generally designated as 10. The optical semiconductor device 10 comprises a support 12 which is shown to be a flat metal disk. An electroluminescent semiconductor diode 14 is mounted on the top surface of the support 12 and is secured thereto by a suitable solder. The electroluminescent diode 14 may be of any construction well known in the art. However, in general, such diodes include adjacent P-type and N-type regions with a PN junction therebetween. The diode exhibits electroluminescense in the vicinity of the PN junction when the diode is biased so as to inject charge carriers of one type into a region where the predominant charge carriers are of the opposite type. Radiation is emitted in conjunction with the recombination of pairs of oppositely charged carriers. The diode 14 is mounted on the support 12 so that the radiation diode is from the diode is emitted away from the support.

Terminal wires 16 extend through openings in the support 12 and project slightly above the top surface of the support. The terminal wires are secured to and electrically insulated from the support by washers 18 of an electrical insulating material, such as glass or ceramic. Each of the terminal wires 16 is electrically connected to a separate contact of the electroluminescent diode 14 by a fine wire 20. A third terminal wire 17 is secured to the support 12 which is electrically connected to the diode 14.

A glass dome 22 is mounted on and secured to the top surface of the support 12. The glass dome 22 extends over and is in intimate contact with the electroluminescent diode 14 so that the radiation emitted by the diode passes through the glass dome. In the semiconductor device 10 shown in FIG. 1, the glass dome 22 is substantially spherical in shape.

Figure 2:
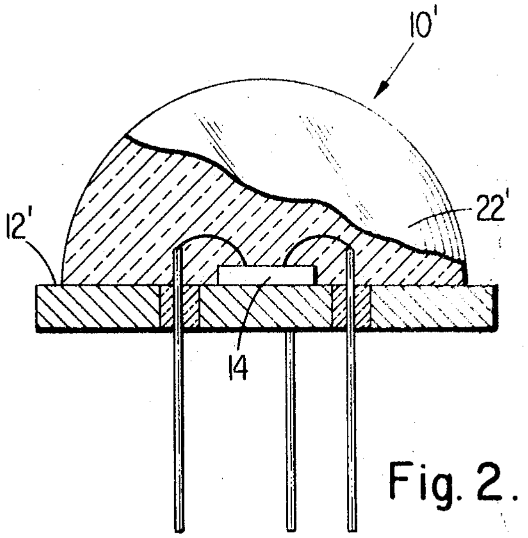
FIG. 2 is a sectional view of another embodiment of the optical semiconductor device.

In FIG. 2 there is shown another embodiment of the optical semiconductor device, generally designated as 10'. The optical semiconductor device 10' is the same as the device 10 shown in FIG. 1 except that the glass dome 22', which is mounted on the support 12' and covers the electroluminescent diode 14', is hemispherical in shape. However, the glass dome can be elliptical, parabolic or any other desired shape to convey the radiation from the diode to a desired receiver in an efficient manner.

The glass dome 22 or 22' is made of a glass having a high index of refraction, preferably greater than 2 and as close as possible to the index of refraction of the electroluminescent diode, and of a slow absorption. Also, the glass must have a viscosity such that it is moldable at temperatures low enough to prevent any chemical reactions between the glass and the electroluminescent diode to prevent any damage to the electrical connections to the diode. In addition, the viscosity of the glass must be low enough at room temperature to permit thermoplastic flow. The flow will relieve any strains caused by any differences in the thermal expansion coefficients of the glass, diode and support and thereby prevent the glass dome from cracking off the support and diode. The glass must also be able to adhere to the diode and the support by fusion.

Glasses which have been found to meet all of the above conditions comprise, e.g., mixtures of arsenic, bromine and either sulfur, selenium or a mixture of sulfur and selenium. More specifically the glasses comprise by weight 19 to 41 percent arsenic, 10 to 25 percent bromine and either 28 to 50 percent sulfur or 65 to 70 percent selenium. When the glass includes both sulfur and selenium, the selenium is included as a replacement for some of the sulfur on a molar basis. It has been found that the index of refraction of these glasses can be increased by the addition of up to 10 percent by weight of tellurium and/or up to 8 percent by weight of iodine. The tellurium is added as a replacement for some of the sulfur or selenium on a molar basis and iodine is added as a replacement for some of the bromine on a molar basis.

Figure 3:
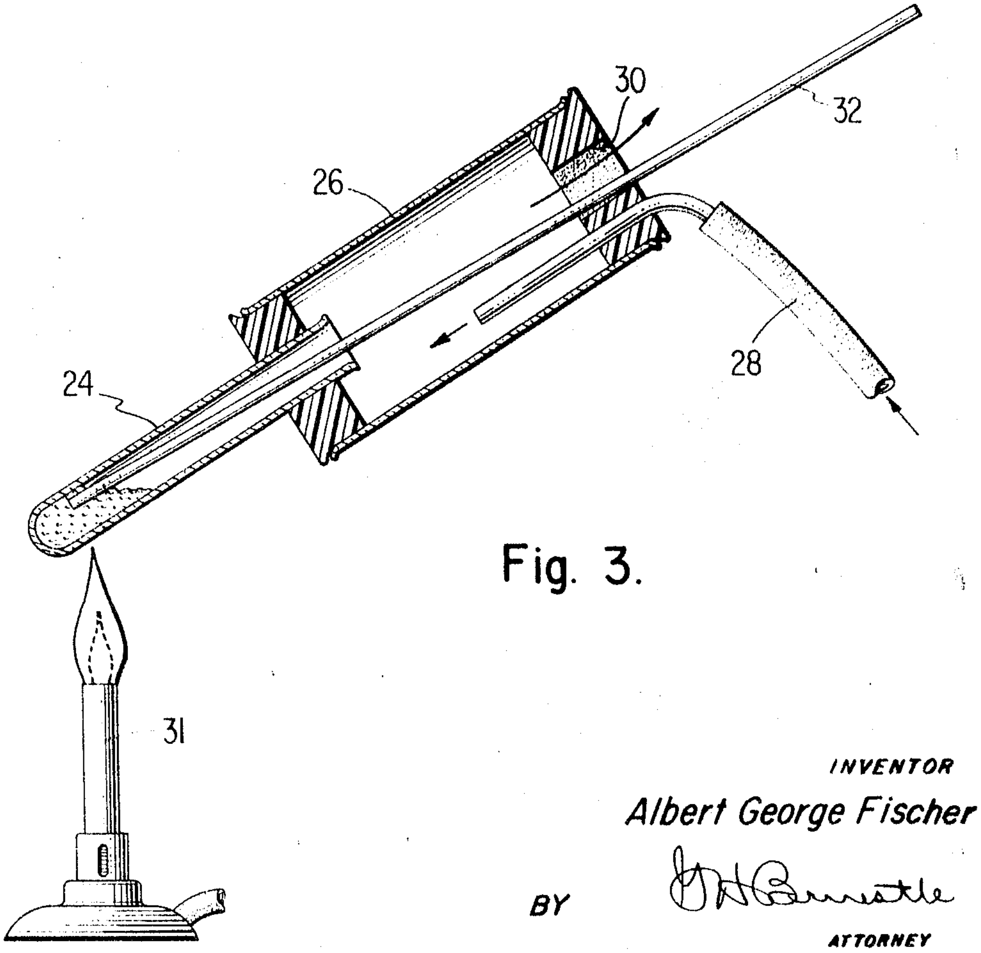
FIG. 3 is a schematic view of an apparatus for making the glass used to make the optical semiconductor device.

To make the glasses, semiconductor grade materials are used. Surface oxides are removed from the sulfur to be used by heating in a vacuum. If selenium and/or tellurium is to be included the surface oxides are removed from these materials by heating in hydrogen. The bromine is dried with calcium chloride and if iodine is to be included it is dried by storing it in a closed vessel with phosphorus pentoxide. Using an apparatus such as shown in FIG. 3, the solid ingredients to be included in the glass, which are all the materials except bromine, in the proper amounts, are placed in a container 24 having a chamber 26 on its open end. The chamber 26 is then filled with an inert gas, such as argon, by admitting a flow of the gas through the inlet tube 28. The inert gas fills the chamber and the container 24 and flows out of the opening 30 in the end of the chamber. While maintaining the flow of the inert gas, the ingredients in the container 24 are heated by a heater 31 until the ingredients melt. When the ingredients are heated they are stirred intensely by a stirring rod 32 so as to thoroughly mix the ingredients together. When the ingredients have melted and are thoroughly mixed together they are allowed to cool to approximately 50° C. The proper amount of bromine, which is in a liquid form, is then added to the mixture. The mixture is then reheated and stirred vigorously as soon as the viscosity of the mixture is low enough. At a temperature where the glass mixture is sufficiently liquid, approximately 200° C., the mixture is homogenized by restirring and then allowed to settle to allow bubbles to escape. The mixture is then allowed to cool to form a vitreous glass body in the container. To remove the glass from the container, the container is cooled to a low temperature, such as by submerging the container in liquid nitrogen, and then heated, such as by placing it in hot water. This causes the glass to crack into small fragments several millimeters in diameter. The fragments can then be removed from the container.

Various glasses of the compositions shown in Table I were made using the method described above. Glasses 1—7, which consisted of arsenic, sulfur and bromine, were yellow in color and had an index of refraction of approximately 2.4. These glasses are used for green emitting diodes as well as red and infrared emitting diodes. Glasses 8—12 were red in color and had an index of refraction of between 2.5 and 2.7. These glasses are useful for red and infrared emitting diodes. Glasses 13 and 14 were black in color and had an index of refraction of approximately 2.9. These glasses are useful for infrared emitting diodes.

TABLE I

| Glass | Composition | | | | | |
|---|---|---|---|---|---|---|
| | Arsenic (grams) | Sulfur (grams) | Selenium (grams) | Tellurium (grams) | Bromine (cc.) | Iodine (grams) |
| 1 | 10 | 10 | | | 2 | |
| 2 | 10 | 11 | | | 2 | |
| 3 | 10 | 12 | | | 2 | |
| 4 | 10 | 13 | | | 2 | |
| 5 | 10 | 13.5 | | | 2 | |
| 6 | 10 | 14 | | | 2 | |
| 7 | 10 | 15 | | | 2 | |
| 8 | 10 | 10 | 10 | | 2 | |
| 9 | 10 | 8 | 15 | | 2 | |
| 10 | 10 | 6 | 20 | | 2 | |
| 11 | 10 | 4 | 25 | | 2 | |
| 12 | 10 | | 35 | | 2 | |
| 13 | 10 | | 35 | | 0.3 | 3 |
| 14 | 10 | | 32 | 5 | 0.3 | 3 |

Figure 4:
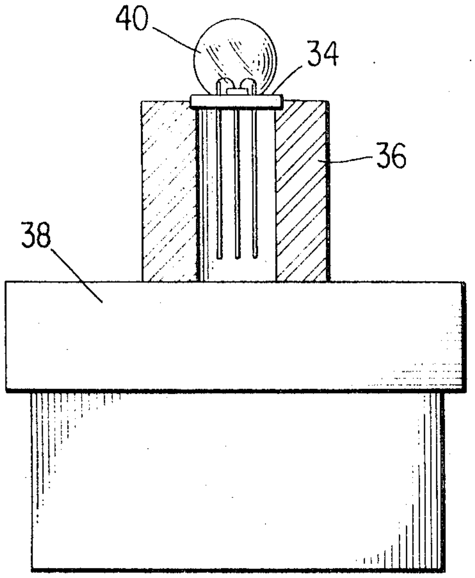
FIG. 4 is a schematic view showing one method of the present invention for making the optical semiconductor device.

The glass domes can be formed on the supports and around the diodes either by a free flowing method or by molding. For the free flowing method pieces of the glass fragments of the desired size are placed on a support and heated until the pieces of glass melt into slightly flattened droplets or beads. After cooling, the glass beads are ready to be mounted on a diode. For the mounting operation on apparatus such as shown in FIG. 4 can be used. The diode and support subassembly 34 is seated on a cylindrical metal support 36 which is mounted on a heater 38. The subassembly is heated in air to approximately 170° C. A glass bead 40 is then placed on the heated subassembly over the diode. The glass bead rapidly melts flowing around the diode and adhering to the support. If the bead is not properly centered on the diode it can be gently push position. The semiconductor device is then lifted from the support 36 and inverted while permitting it to cool. Inverting the semiconductor device causes the glass dome to round out under the influence of surface tension, gravity, viscosity and wetting adhesion forces and thereby take the substantially spherical shape shown in FIG. 1. The resulting glass dome has a perfectly smooth surface.

Figure 5:
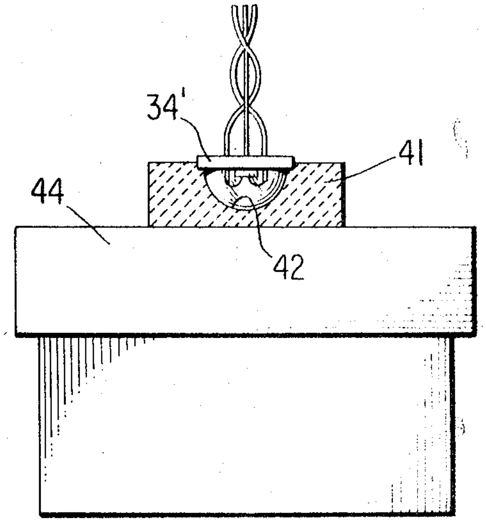
FIG. 5 is a schematic view showing another method of making the optical semiconductor device.

To form the glass dome on the diode and support subassembly by molding, an apparatus such as shown in FIG. 5 can be used. The apparatus includes a mold 41 having a mold cavity 42 in its top surface of the shape of the dome desired to be formed. As shown, the mold cavity 42 is hemispherical in shape to form a hemishperical shaped dome such as shown in FIG. 2. The mold 41 can be made of any suitable material which can withstand the heat to be used and to which the glass will not readily adhere. Molds of silicone rubber have been found to be satisfactory. The mold 41 is seated on a heater 44 which will heat the mold to approximately 170° C. The glass is placed in the mold cavity 42 where it is melted. Sufficient glass is melted in the mold cavity 42 to completely fill the cavity. The diodes and support subassembly 34' is then placed over the mold cavity with the diode being submerged with the glass as shown in FIG. 5. The glass also contacts and adheres to the surface of the support. The assembly is then cooled to harden the glass and the semiconductor device is then removed from the mold.

Figure 6:
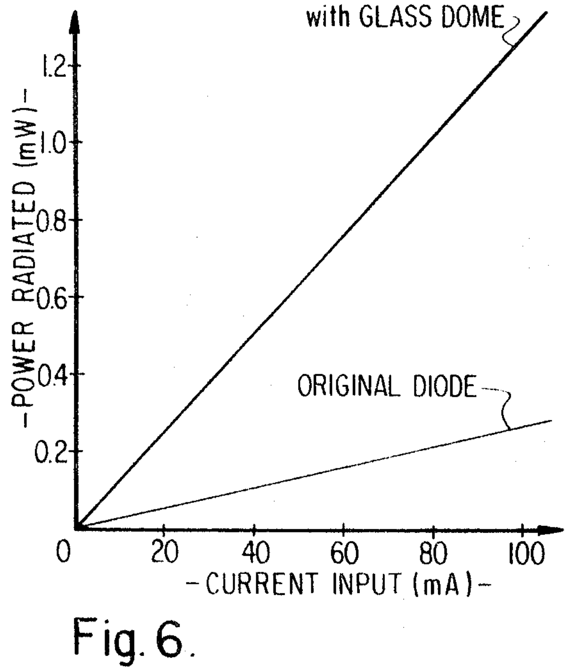
FIGS. 6 and 7 are graphs showing the room temperature external emission vs. current characteristics of typical optical semiconductor device of the present invention.
Figure 7:
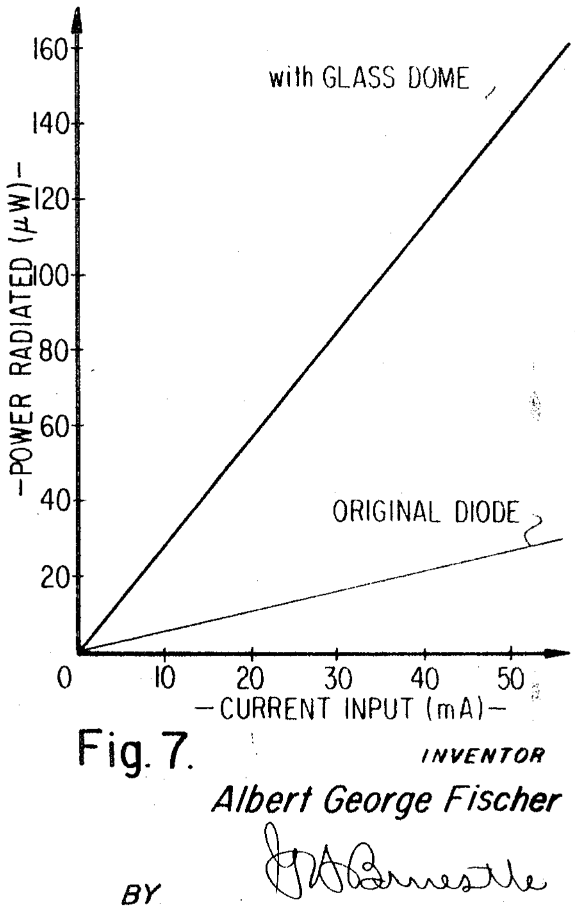

The optical semiconductor devices of the present invention having a glass dome covering the electroluminescent semiconductor diode have been found to have room temperature external emission efficiencies of up to six times better than the same electroluminescent semiconductor diode without the glass dome. For example, optical semiconductor devices of the construction such as shown in FIG. 1 where made using GaAs electroluminescent diodes and glass domes of the composition of glass 5 in Table I which composition was found to have the best characteristics of the yellow glasses. The diodes were 0.02—0.25 inches square and the glass domes were about 0.10 inches in diameter. The glass domes were formed on the device by the free-flowing method described above. The room temperature external emission vs. current characteristics of the diodes are measured before and after the glass domes were applied to the diodes. The results of this test are shown in FIG. 6 where it can be seen that the external emission efficiency of the diode with the glass dome is a out 5.1 times better than the same diode without the dome. Similarly, optical semiconductor devices were made using a $GaAs_{0.6}P_{0.4}$ electroluminescent diode and a glass dome of the composition of glass 9 of Table I which composition was found to have the best characteristics of the red glasses. The room temperature external emission vs. current characteristics of the diode before and after the glass dome was formed on the diode are shown in FIG. 7. As can be seen from FIG. 7 the external emission efficiency of the optical semiconductor devices with the glass dome was about 5.3 times better than that of the diode without the glass dome. Thus, it can be seen that by providing a glass dome over the electroluminescent diode the external emission efficiency is greatly increased.

Another advantage of the optical semiconductor device of the present invention is that by varying the shape of the glass dome different far-field emission patterns can be obtained. For example, an optical semiconductor device of the construction shown in FIG. 1 having a glass dome approximately 0.10 inches in diameter formed by the free-flowing method over an electroluminescent diode 0.020—0.25 inches square provided a rather broad spatial pattern such as shown in FIG. 8*b*. However, an optical semiconductor device of the construction shown in FIG. 2 having a glass dome approximately three-eighths inches in diameter formed by the molding method over an electroluminescent diode 0.020—0.25 inches square provided a somewhat more beamlike pattern shown in FIG. 8*a*.

I claim:

1. An optical semiconductor device comprising an electroluminescent semiconductor diode and a glass dome covering and in intimate contact with said diode so that any radiation emitted from the diode will pass through the dome, said glass dome being of a composition consisting essentially of, by weight, 19 to 41 percent arsenic, 10 to 25 percent bromine and a chalcogen selected from the group consisting of 28 to 50 percent of sulfur, 65 to 70 percent selenium and mixtures thereof wherein in the mixture selenium replaces sulfur on a molar basis.

2. An optical semiconductor device in accordance with claim 1 including a support, the diode being mounted on said support so as to emit radiation away from the support and the glass dome is mounted on said support and extends over the diode.

3. An optical semiconductor device in accordance with claim 1, in which the glass of the dome includes up to 10 percent of tellurium as a replacement for a corresponding amount of the chalcogen on a molar basis.

4. An optical semiconductor device in accordance with claim 1 in which the glass of the dome includes up to 8 percent of iodine as a replacement for a corresponding amount of the bromine on a molar basis.

5. An optical semiconductor device in accordance with claim 1 in which the glass dome is of a composition consisting essentially of by weight 34 percent arsenic, 46 percent sulfur and 20 percent bromine.

6. An optical semiconductor glass in accordance with claim 1 in which the glass dome is of a composition consisting essentially of by weight 57.7 percent arsenic, 20.6 percent sulfur, 38.6 percent selenium and 15.1 percent bromine.